United States Patent [19]
Honma

[11] Patent Number: 5,365,527
[45] Date of Patent: Nov. 15, 1994

[54] LOGICAL COMPARISON CIRCUIT

[75] Inventor: Tatsuya Honma, Gyoda, Japan

[73] Assignee: Advantest Corporation, Tokyo, Japan

[21] Appl. No.: 729,996

[22] Filed: Jul. 15, 1991

[30] Foreign Application Priority Data

Jul. 18, 1990 [JP] Japan .................................. 2-189716

[51] Int. Cl.$^5$ ........................................... G01R 31/28
[52] U.S. Cl. ................... 371/25.1; 340/146.2
[58] Field of Search ...................... 371/25.1; 340/146.2

[56] References Cited

U.S. PATENT DOCUMENTS

4,270,116  5/1981  Ichimaya et al. ................. 340/146.2

Primary Examiner—Stephen M. Baker
Attorney, Agent, or Firm—Staas & Halsey

[57] ABSTRACT

A sample data signal obtained by sampling the response output from an IC under test is converted by an interleave circuit into n trains of low-speed signals each having an n-fold period. The trains of low-speed signals are strobed out by n-phase pulses generated by a multiphase pulse generator from a system clock synchronized with an expected value pattern signal. The strobed-out signals are combined into a data signal of the original frequency synchronized with the expected value pattern signal. The data signal synchronized with the expected value pattern signal is compared by a comparator circuit with the expected value pattern signal.

5 Claims, 5 Drawing Sheets

LOGICAL COMPARISON CIRCUIT

BACKGROUND OF THE INVENTION

The present invention relates to a logical comparison circuit for use in IC test equipment.

Figure 1:
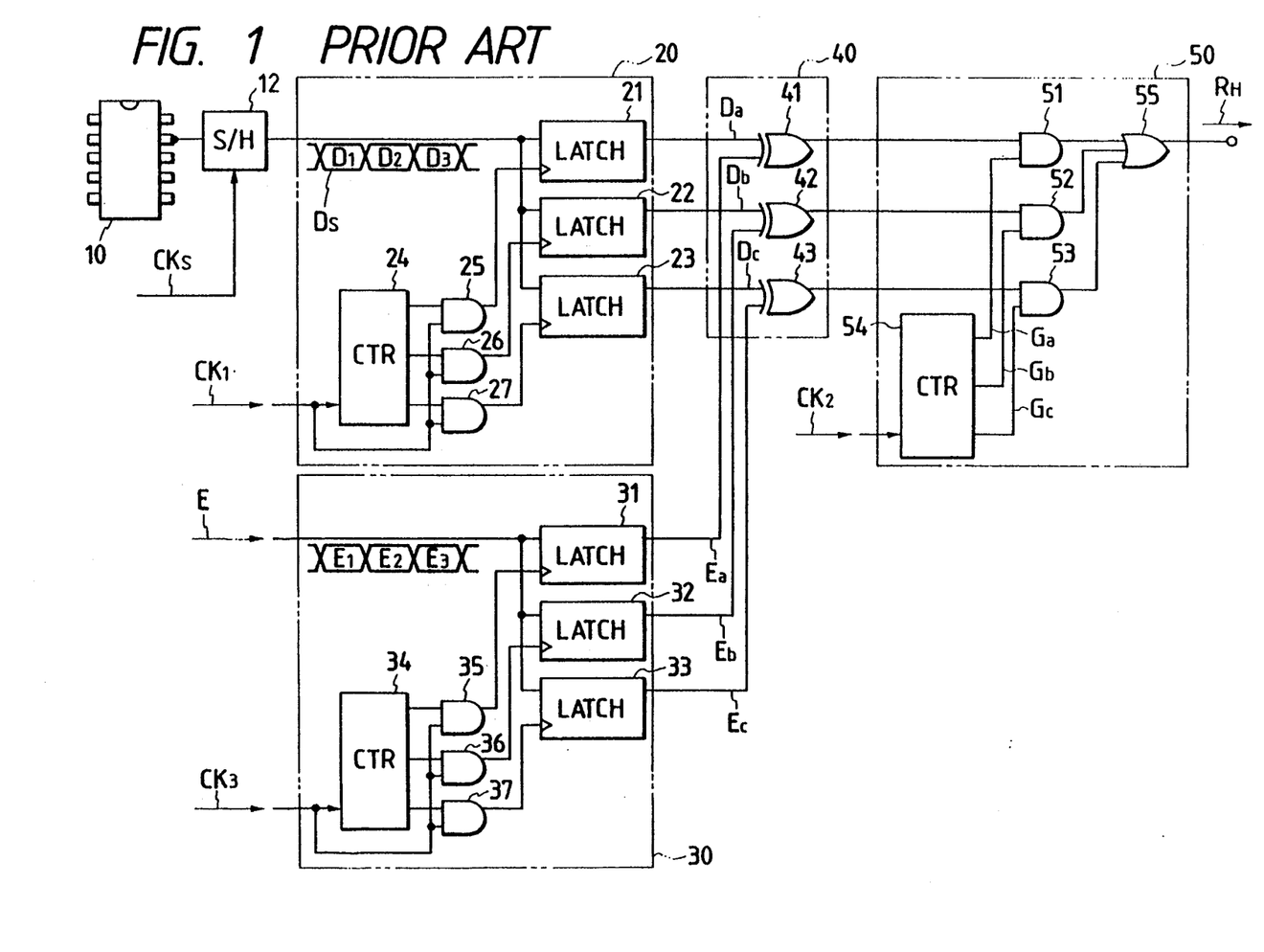
FIG. 1 is a block diagram of a prior art circuit.

FIG. 1 illustrates a conventional logical comparison circuit. Reference numeral 10 indicates an IC under test, 12 is a sample-hold circuit which fetches and holds therein the output signal from the IC under test 10 every sampling clock $CK_S$, 20 is a first interleave circuit which converts a sample data signal $D_S$ from the sample-hold circuit 12 into a plurality of expanded, low-speed parallel data signals Da, Db and Dc, 30 is a second interleave circuit which converts an expected value pattern signal E into a plurality of expanded, low-speed signals Ea, Eb and Ec, 40 is a comparator circuit which compares the sample data signal and the expected value pattern signal converted by the first and second interleave circuits 20 and 30 into signals of lower frequencies and judges their match or mismatch, and 50 is a period converter which converts the comparator output into a signal of the original period.

Figure 2:
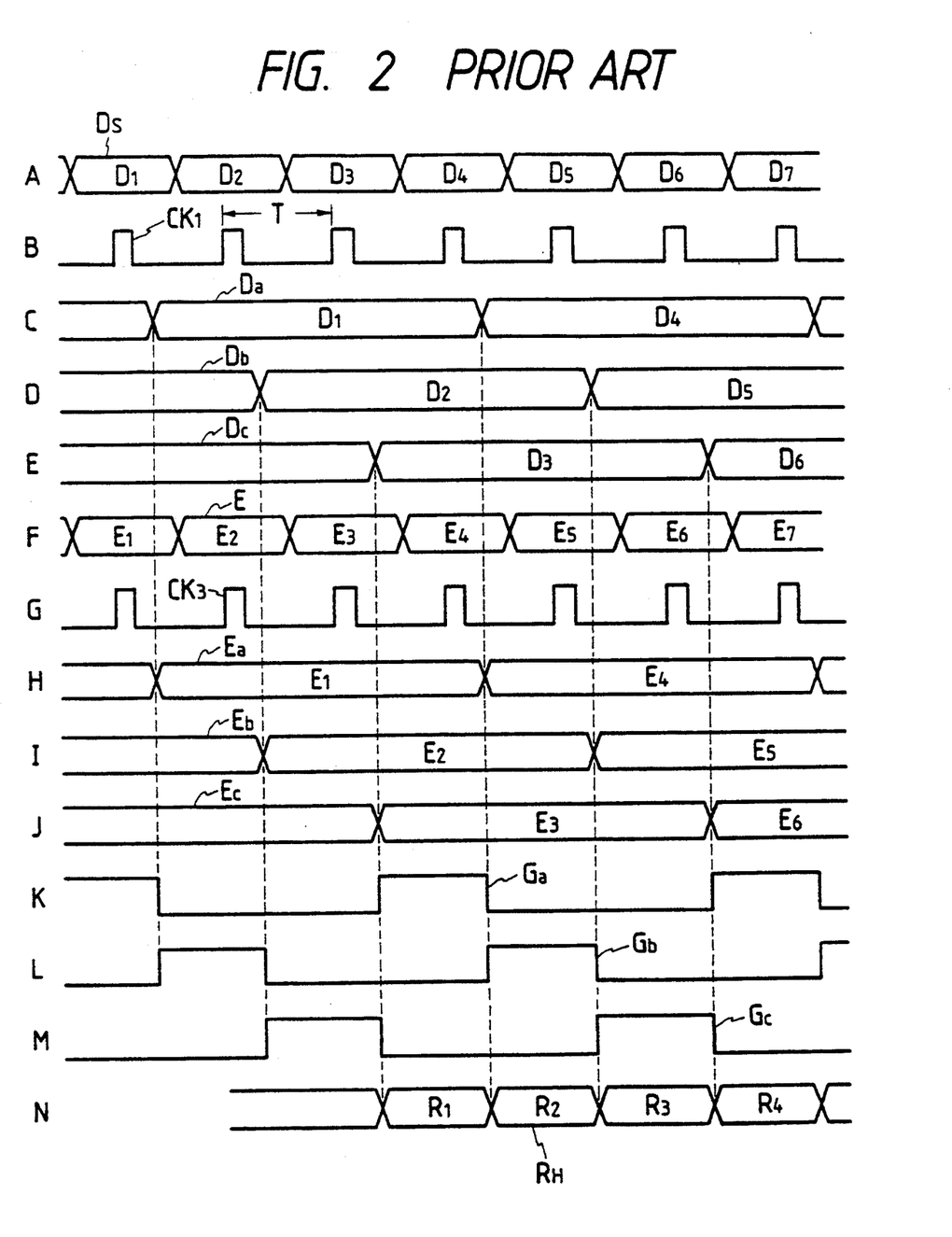
FIG. 2 is a timing chart for explaining the operation of FIG. 1.

With such test equipment, a test pattern from a pattern generator (not shown) is applied to the IC under test 10 in synchronization with a test clock $CK_1$, the output response signal from each pin of the IC 10 is compared by the logical comparison circuit with an expected value pattern and the result of comparison is stored in a memory and analyzed. The test clock $CK_1$ for determining the timing for the application of the test pattern is variable within two test cycles, for example. The output response signal from each pin of the IC 10 is held in the sample-hold circuit 12 by a sampling clock $CK_S$ synchronized with the test clock $CK_1$. In the first interleave circuit 20 gates 25, 26 and 27 are enabled one by one in a repeating cyclic order, by a counter 24 which cyclically shifts its high-level output bit position upon each application thereto of the test clock $CK_1$. Pieces of sample data $D_1$, $D_2$, $D_3$, . . . are sequentially fetched into latch circuits 21, 22 and 23 by the clock $CK_1$ passing through the gates 25, 26 and 27 one after another. By this, a sample data signal $D_S$ shown on Row A in FIG. 2 is converted to three parallel low-speed data signals $Da=D_1, D_4, D_7, \ldots$, $Db=D_2, D_5, D_8, \ldots$ and $Dc=D_3, D_6, D_9, \ldots$, each having a three-fold period 3T as shown on Rows C, D and E in FIG. 2. Similarly, the second interleave circuit 30 is also made up of a counter 34, gates 35, 36 and 37 and latch circuits 31, 32 and 33. The second interleave circuit converts, by a system clock $CK_3$ shown on Row G in FIG. 2, the expected value pattern signal E synchronized with a fixed system clock, shown on Row F in FIG. 2, into three low-speed data signals $Ea=E_1, E_4, \ldots$, $Eb=E_2, E_5, \ldots$ and $Ec=E_3, E_6, \ldots$ as depicted on Rows H, I and J in FIG. 2. The corresponding pieces of data of the low-speed signals Da, Db, Dc and Ea, Eb, Ec, that is, $D_1$ and $E_1$, $D_2$ and $E_2$, $D_3$ and $E_3$, . . . are subjected to logical comparison, in pairs, by comparators 41, 42 and 43 of the comparison circuit 40 to see if the logic of the data of the signals Da, Db and Dc matches the logic of the data of the expected value pattern signals Ea, Eb and Ec. The comparators 41, 42 and 43 may each be formed by an exclusive OR circuit. In the period converter 50 the results of comparison by these comparators 41, 42 and 43 pass through gates 51, 52 and 53 in periods specified by gate signals Ga, Gb and Gc. These signals are shown on Rows K, L and M in FIG. 2, and are generated by a counter 54 which circulates in synchronization with a system clock $CK_2$, and the gate outputs are combined by an OR gate 55 into the signal of the initial period T, which is output as a decision signal $R_H$ (shown on Row N in FIG. 2). In any of the counters 24, 34 and 54 any one of outputs of three bits is always a high-level. Upon each application of an input clock, the high-level bit position cyclically shifts on a bitwise basis. Such a counter may be formed by a ring counter, but the three-bit output counter, for example, can easily be formed using two flip-flops, one NOR gate and three inverters.

As described above, the conventional logical comparison circuit has a construction in which the sample data signal $D_S$ and the expected value pattern signal E are converted into low-speed signals each having a three-fold period. The logical comparison is made using low-speed signals having long periods. The reason for this is that the phase of the sample data signal $D_S$ may sometimes be varied. That is to say, during a test the phase of the test pattern signal to the IC under test 10 is varied by changing the phase of the test clock $CK_1$ to check the range of phase over which the IC 10 normally operates in response to the change in the phase of the input signal. Since the response signal from the IC under test 10 is also subjected to sampling by the sampling clock $CK_S$ synchronized with the test clock $CK_1$, the phase of the sample data signal $D_S$ also varies. As a result of this, the sample data signal $D_S$ is displaced apart in phase from the expected value pattern signal E synchronized with a fixed system clock. In such an instance, if the two signals are compared intact, there is the possibility that the cycle of the sample data signal $D_S$ and the cycle of the expected value pattern signal E deviate from each other, making it impossible to compare their corresponding cycles.

On this account, according to the prior art, the sample data signal $D_S$ and the expected value pattern signal E are both converted to signals of longer periods to thereby provide for an extended period for comparison so that the corresponding cycles of both signals overlap for the logical comparison thereof. Moreover, both signals are made low-speed by the above-mentioned extension of their periods so that they are compared in the form of low-speed signals. This permits the use of low-cost circuit elements for the logical comparison of high-speed signals. Such a conventional circuit structure as mentioned above, however, calls for two interleave circuits, and hence inevitably becomes large-scale.

SUMMARY OF THE INVENTION

It is therefore an object of the present invention to provide a logical comparison circuit which permits reduction of its circuit scale.

According to the present invention, a sample data signal obtained by sampling the response output of an IC under test is converted by an interleave circuit into n trains of low-speed signals having an n-fold period. The n trains of low-speed signals are strobed out by n-phase pulses derived from a system clock synchronized with an expected value pattern signal. The logical sum of the strobed-out signals is obtained and is then converted to a signal of the original period synchronized with the expected value pattern signal. This signal and the expected value pattern signal are subjected to a logical comparison.

The present invention calls for only one interleave circuit, and hence affords reduction of the scale of the logical comparison circuit.

DESCRIPTION OF THE PREFERRED EMBODIMENTS

Figure 3:
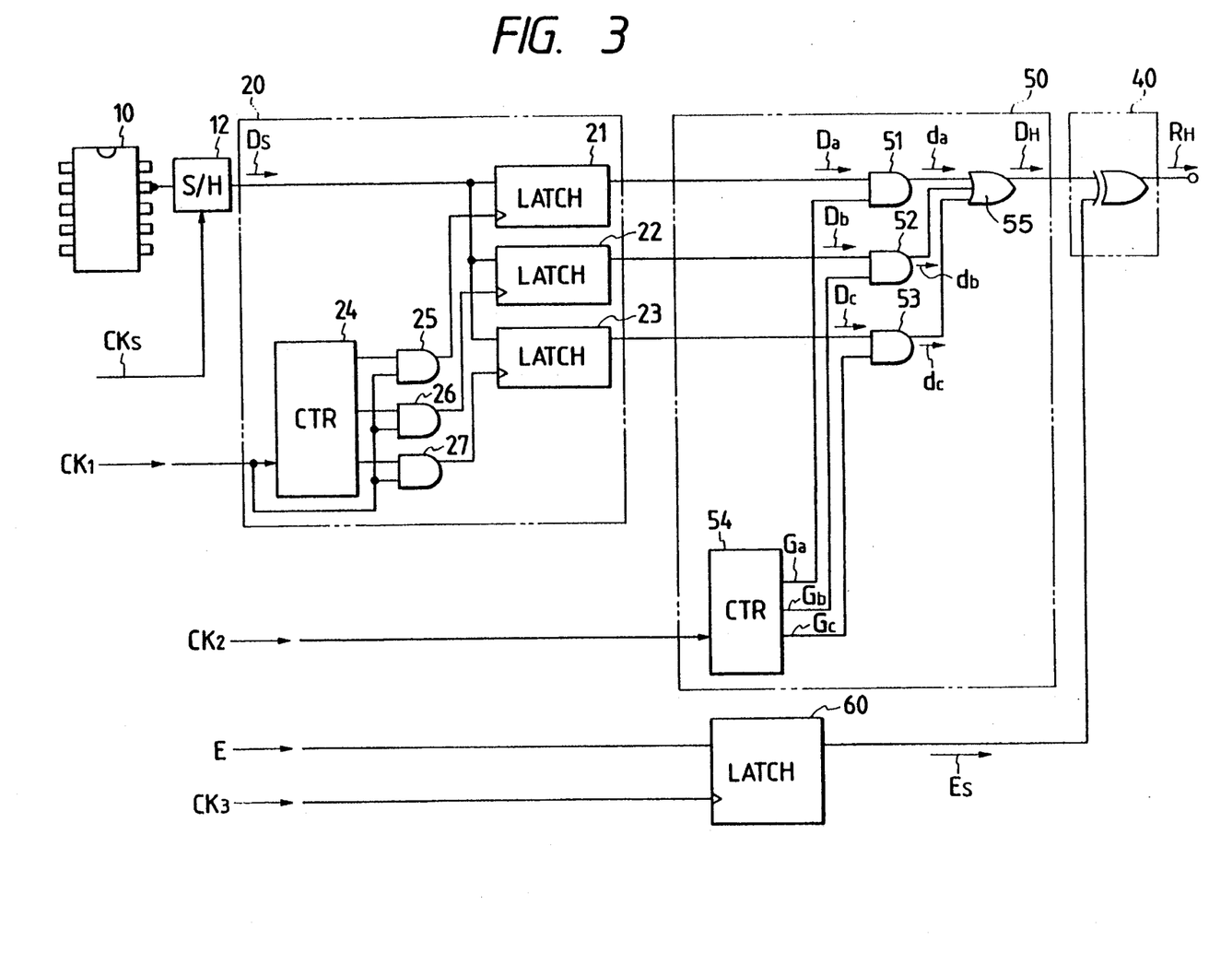
FIG. 3 is a block diagram of a first embodiment according to the present invention.

FIG. 3 is a block diagram of a first embodiment of the present invention. Reference numeral 10 denotes an IC under test, 12 a sample-hold circuit, 20 an interleave circuit, 50 a period converter and 40 a comparison circuit. In the present invention, a response signal from the IC under test 10 is subjected to sampling by the sample-hold circuit 12. The sample data signal $D_S$ output therefrom is converted by the interleave circuit 20 into the low-speed signals Da, Db and Dc having different phases shifted by $\frac{1}{3}$ cycle from one to another as in the case of the prior art described previously with respect to FIG. 1. In the first embodiment the interleave circuit 20 includes three latch circuits 21, 22 and 23, by which the sample data signal $D_S$, shown on Row A in FIG. 4, is converted, in synchronization with the test clock $CK_1$ shown on Row B in FIG. 4, into the low-speed signals Da, Db and Dc having three phases depicted in Rows C, D and E in FIG. 4.

The low-speed signals Da, Db and Dc each have a period 3T three times longer than the period T of the sample data signal $D_S$. These expanded low-speed signals Da, Db and Dc are strobed out by multi-phase pulses Ga, Gb and Gc on Rows G, H and I, synchronized with the system clock $CK_2$ depicted on Row F in FIG. 4. That is, the period converter 50 is identical in construction with that shown in FIG. 1 and is formed by gates 51, 52 and 53, a multi-phase pulse generator 54 and an OR gate 55. The multi-phase pulse generator 54 is identical in construction with the counter 54 in FIG. 1. The multi-phase generator 54 counts the system clock pulses $CK_2$, shown on Row F in FIG. 4, synchronized with the expected value pattern signal E depicted in Row N in FIG. 4 and generates the pulses Ga, Gb and Gc having different phases shown on Rows G, H and I in FIG. 4.

The gates 51, 52 and 53 are supplied at one of the input terminals with the low-speed signals Da, Db and Dc, respectively, from the interleave circuit 20. The low-speed signals Da, Db and Dc are strobed out by the pulses Ga, Gb and Gc having different phases, whereby signals da, db and dc synchronized with the pulses Ga, Gb and Gc are obtained at the outputs of the gates 51, 52 and 53, respectively, as shown in Rows J, K and L in FIG. 4. As will be seen from FIG. 4, even if the low-speed signals Da, Db and Dc are delayed for a maximum of two test cycles due to a delay in the phase of the sample data signal $D_s$, the pulses Ga, Gb and Gc having different phases will stay within the cycles of the corresponding low-speed signals. Consequently, the signals Da, Db and Dc can be strobed out by the pulses Ga, Gb and Gc corresponding thereto. The strobed-out signals pa, pb and pc are ORed by the OR gate 55 to provide at its output a succession of high-speed signals $D_H$ shown in Row M in FIG. 4.

Figure 4:
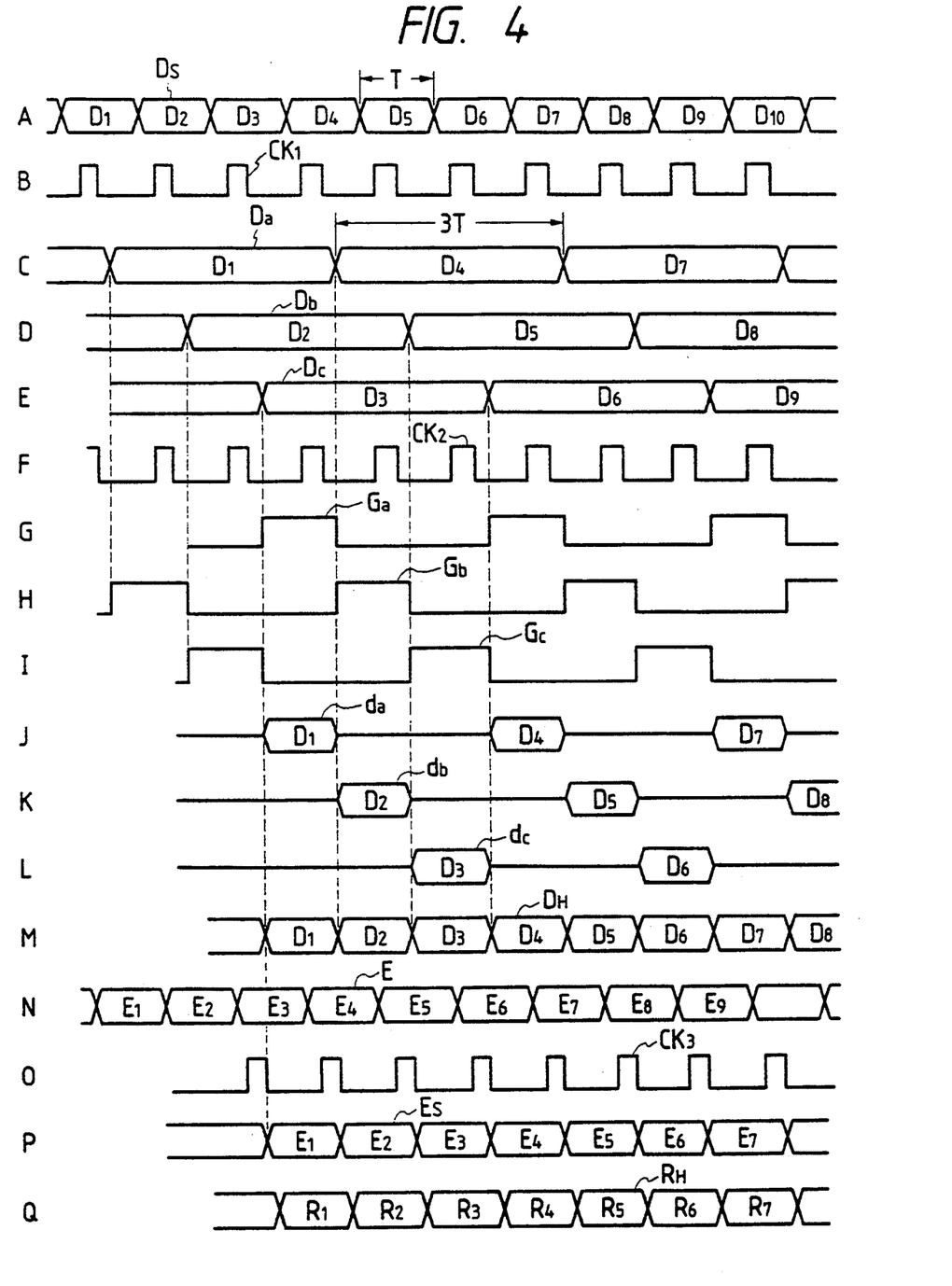
FIG. 4 is a timing chart for explaining the operation of the circuit in FIG. 3.

The expected value pattern signal E depicted in Row N in FIG. 4 is applied to a latch circuit 60, wherein it is timed by the system clock $CK_3$ shown in Row O in FIG. 4 and from which is obtained an expected value pattern signal $E_S$ (Row P in FIG. 4) synchronized with the system clock $CK_3$. The expected value pattern signal $E_S$ thus obtained is applied to the logical comparison circuit 40 for comparison with the high-speed signal $D_H$ from the period converter 50. That is, the high-speed signal $D_H$ is synchronized with the system clock $CK_2$ and the expected value pattern signal $E_S$ is also synchronized with the system clock $CK_3$, and hence they are synchronized with each other. Therefore, the high-speed signal $D_H$ and the expected value pattern signal $E_S$ can always be subjected to the logical comparison in their corresponding cycles. As a result of this, it is possible to obtain the high-speed signal $R_H$ indicating the result of the logical comparison as shown in Row Q in FIG. 4.

As described above, according to the present invention, the sample data signal $D_S$ is once converted into the low-speed signals Da, Db and Dc. These low-speed signals are converted into the high-speed signal $D_H$ by the system clock $CK_2$ synchronized with the expected value pattern signal $E_S$. Consequently, the high-speed signal $D_H$ is synchronized with the expected value pattern signal $E_S$. Thus, the high-speed signal $D_H$ and the expected value pattern signal $E_S$ can be subjected to the logical comparison.

As will be appreciated from the above, the present invention precludes the necessity of converting the expected value pattern signal $D_S$ into low-speed signals. Hence, it calls for only one interleave circuit, permitting the reduction of the scale of the circuit construction.

Figure 5:
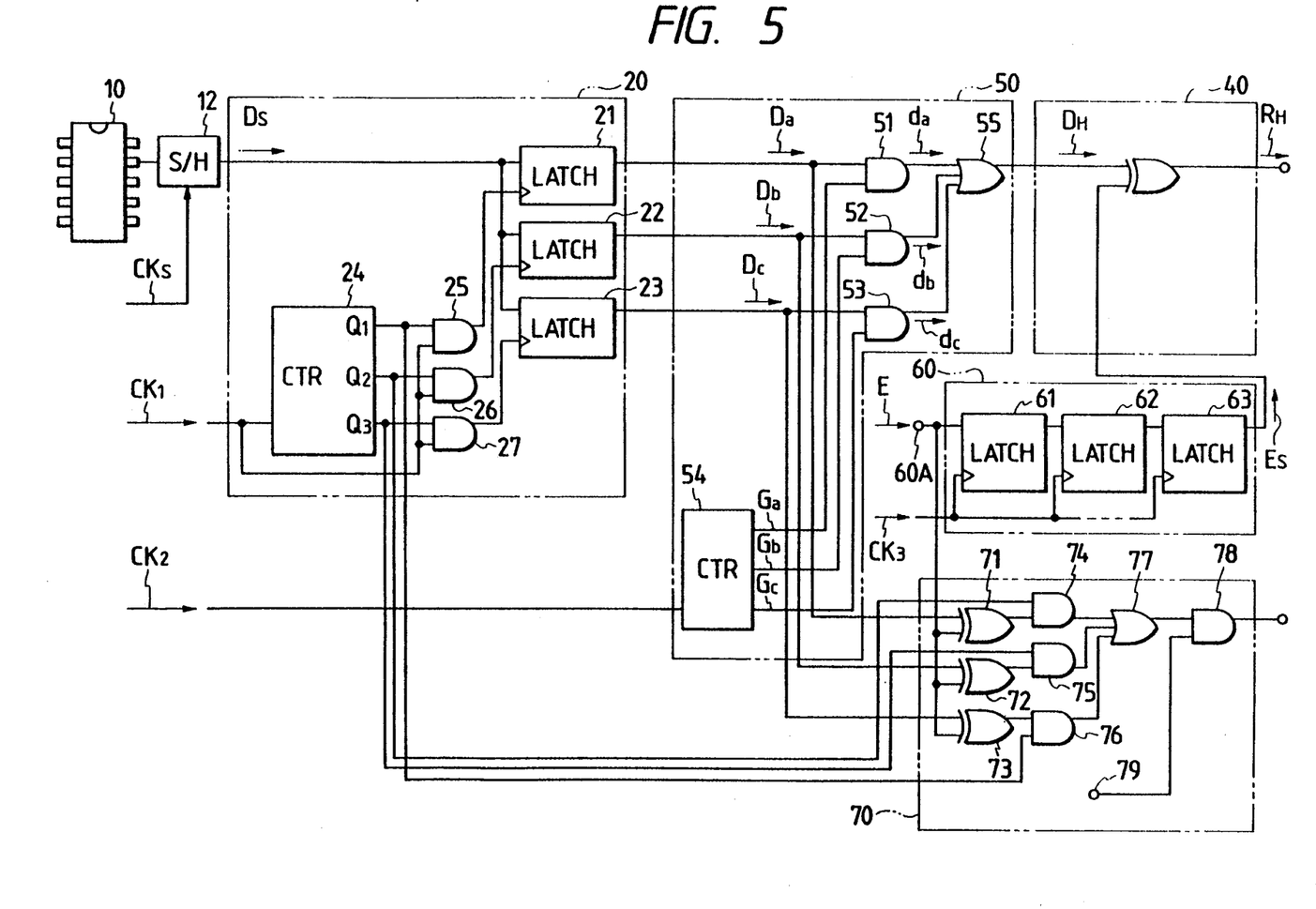
FIG. 5 is a block diagram of a second embodiment according to the present invention.

FIG. 5 is a second embodiment of the present invention, which includes a branch condition detector 70 for detecting a branch condition. In the actual IC test equipment a plurality of such logical comparison circuits as shown in FIG. 5 are provided corresponding to pins of the IC under test 10. The branch condition is given as a conditional value for starting a predetermined operation when pieces of parallel bit data output from a predetermined number of pins agree with the conditional value. For example, in the case of testing an IC for a watch, a clock is applied to the IC to cause it to perform a clocking operation. At a predetermined point of time, for instance, at 00:00:00, a test is started to see if the clocking operation is normal (i.e. the comparison of the clocking and an expected value is started). In FIG. 5, one bit of the conditional value which is the branch condition is repeatedly applied, as an initial value of the expected value pattern signal E, from a pattern generator (not shown) to the latch circuit 60 and the branch condition detector 70. The branch condition detector 70 monitors whether the low-speed signals Da, Db and Dc from the interleave circuit 20 coincide with the initial value of the expected value pattern signal E and when coincidence is detected between them (in practice, when coincidence is simultaneously detected, by a plurality of logical comparison circuits, between the low-speed signals and respective bits of the conditional value), the detected output is provided to a controller of the IC test equipment (not shown) to initiate the test at that point of time. Thus, the generation of a predetermined test pattern and expected pattern is started and the compared output $R_H$ is fetched in a memory of the test equipment. Now, let it be assumed that the branch condition is detected from the output of the comparison circuit 40 in FIG. 3 so as to perform such a conditional branch as mentioned above. As will be understood from FIG. 4, for example, if the result of comparison $R_3$ Row Q satisfies the branch condition, then the expected value that is input into the latch circuit 60 at that time has already become $E_5$ as shown in row N. Therefore, if generation of the initial value and the subsequent expected value patterns ($E_6$ in row N) is started in response to the detection of the branch condition, then the results of comparison will be $R_6$ in row Q. Since the IC steps upon each application of the clock during this time, the test is actually started after the predetermined point of time 00:00:00, and consequently, conditional branch is impossible at the time 00:00:00.

In the embodiment of FIG. 5, the latch circuit 60 is formed by a cascade connection of three latches 61, 62 and 63, and the expected value pattern signal E is delayed by the latch circuit 60 for two clock cycles and is then applied to the comparison circuit 40. The branch condition detector 70 comprises comparators 71, 72 and 73, AND gates 74, 75 and 76, an OR gate 77 and an AND gate 78. The comparators 71, 72 and 73 compare the expected value pattern signal E and the expanded low-speed signals Da, Db and Dc from the interleave circuit 20, respectively. The gates 74, 75 and 76 are supplied at one input with the compared outputs from the comparators 71, 72 and 73 and at the other input with $Q_2$, $Q_3$ and $Q_1$ outputs of the counter 24. The gates 74, 75 and 76 provide the results of comparison in the former one-third period of each cycle of the expanded low-speed data signals Da, Db and Dc depicted in rows C, D and E in FIG. 4. The results of the comparison thus obtained are sequentially output via the OR gate 77 and the AND gate 78. The AND gate 78 is supplied at one input with an enable signal for the conditional branching operation. Accordingly, a branch condition is repeatedly provided to a terminal 60A, for example, as the initial value $E_0$ of the expected value pattern signal E depicted in row N in FIG. 4. When it is detected by the branch condition detector 70 that the branch condition is satisfied by $E_3$ ($E_3=E_2=E_1=E_0$), that is, $E_3$ coincides with the expanded low-speed data $D_3$, the detected output is applied to the controller of the test equipment. Thereafter, the test pattern (not shown) and the expected value pattern signal E in the pattern generator are set to predetermined values. By this, the expected value pattern signal E depicted in Row N in FIG. 4 becomes predetermined in the cycle of the data $E_4$ and in subsequent cycles. The results of comparison between the predetermined expected value pattern signal E and the high-speed data $D_4$, $D_5$, . . . shown in row M, made in the cycle of the expected value data $E_4$ and the subsequent cycles, are obtained from the comparison circuit 40. With such an arrangement as shown in FIG. 5, once the sample data signal $D_S$ satisfies the branch condition (00:00:00, for instance), all pieces of sample data $D_S$ thereafter can be compared with the corresponding pieces of data of the expected value pattern signal.

In the embodiments of FIGS. 3 and 4 the interleave circuit 20 is shown to convert the sample data signal $D_S$ to the three trains of expanded low-speed data signals. The interleave circuit 20 can also convert it can usually be converted the sample data signal $D_S$ to an arbitrary number n of low-speed data signals. In such a case, the latch circuit 60 is formed by latches having n stages.

As described above, according to the present invention, only the sample data signal $D_S$ is converted to the expanded parallel low-speed signals Da, Db and Dc, which are strobed out by the system clock $CK_2$ synchronized with the expected value pattern signal E for conversion into the high-speed signal $D_H$. Consequently, the high-speed signal $D_H$ and the expected value pattern signal E are synchronized with each other. Accordingly, the expected value pattern signal E need not be converted to a low-speed signal for comparison with the response signal from the IC under test. Since only one interleave circuit is needed for converting a high-speed signal into a low-speed signal, the scale of the logical comparison circuit can be reduced and its manufacturing costs can be cut accordingly.

It will be apparent that many modifications and variations may be effected without departing from the scope of the novel concepts of the present invention.

What is claimed is:

1. A logical comparison circuit comprising:
   an interleave circuit including n latch circuits, whereby a sample data signal is latched in said n latch circuits in synchronization with a test clock, n being an integer equal to or greater than 2, for conversion to n trains of low-speed signals each having a period n times longer than that of said test clock;
   a multi-phase pulse generator for generating n pulse signals having different phases synchronized with an expected value pattern signal;
   a period converter, operatively connected to said interleave circuit and said multi-phase pulse generator, for converting said converted low-speed signals from said interleave circuit which are extracted by said n pulse signals having different phases, into a high-speed signal; and
   a comparator, operatively connected to said period converter, for comparing said high-speed signals with said expected value pattern signal to decide whether said sample data signal coincides with said expected value pattern signal.

2. A logical comparator according to claim 1, wherein said multi-phase pulse generator includes counter means which counts first system clock pulses and generates n trains of pulse signals each having a period n times longer than that of said first system clock pulses and sequentially delayed in phase by a 1/n period, and wherein said period converter includes n AND gates which are supplied at one input with said n trains of pulse signals as gate signals, respectively, and at the other input with the outputs from said n latch circuits and an OR gate for combining the outputs of said AND gates into said high-speed signal.

3. The logical comparison circuit of claim 2, wherein said interleave circuit includes:
   second counter means for counting pluses of said test clock and generating n trains of second gate signals each having a period n times longer than that of said test clock pulses and sequentially delayed in phase by a 1/n period; and
   n second AND gates supplied at one input with said n trains of second gate signals, respectively, for permitting the passage therethrough of said test clock pulses supplied to the other inputs thereof, the output of said n second AND gates being applied to said n latch circuits.

4. A logical comparison circuit according to claim 3, further comprising:

n cascade-connected latches which fetch therein said expected value pattern signal in synchronization with a second system clock pulse and shift said expected value pattern signal from one stage to another upon each occurrence of said second system clock pulse, said expected value pattern signal from the last one of said n latches being applied to said comparator; and branch condition detector means for outputting a detected signal when detecting that said sample data signal has reached a predetermined branch condition value, said branch condition detector means including:

n comparators for comparing said expected value pattern signal input into said n latches and said n trains of low-speed signals from said n latch circuits of said interleave circuit, respectively;

n comparison result strobe-out means for strobing out former one-third portions of the cycles of the outputs from said n comparators; and combining means for combining the outputs of said n comparison result strobe-out means into an output signal.

5. A logical comparison circuit according to claim 4, wherein said n comparison result strobe-out means includes n third AND gates controlled by said n trains of second gate signals from said second counter means to strobe out the results of the comparison by said n comparators.

* * * * *

UNITED STATES PATENT AND TRADEMARK OFFICE
CERTIFICATE OF CORRECTION

PATENT NO.    : 5,365,527
DATED         : November 15, 1994
INVENTOR(S)   : Tatsuya HONMA It is certified that error appears in the above-indentified patent and that said Letters Patent is hereby corrected as shown below:

Column 3, line 51, delete "on" and insert --in--.

Column 4, line 26, delete "are converted" and insert --are then converted--.

Column 5, line 8, delete "$R_3$ Row Q" and insert --$R_3$ in Row Q--;

line 67, delete "it can usually"; and line 68, delete "be converted".

Signed and Sealed this

Twenty-first Day of February, 1995

Attest:

BRUCE LEHMAN

*Attesting Officer*       *Commissioner of Patents and Trademarks*